(12) United States Patent
Ponoth et al.

(10) Patent No.: US 7,960,276 B2
(45) Date of Patent: Jun. 14, 2011

(54) CONDUCTOR-DIELECTRIC STRUCTURE AND METHOD FOR FABRICATING

(75) Inventors: Shom Ponoth, Fishkill, NY (US); David L. Rath, Stormville, NY (US); Chih-Chao Yang, Poughkeepsie, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/128,713

(22) Filed: May 29, 2008

(65) Prior Publication Data

US 2008/0284019 A1 Nov. 20, 2008

Related U.S. Application Data

(62) Division of application No. 11/286,093, filed on Nov. 23, 2005, now abandoned.

(51) Int. Cl.
*H01L 21/4763* (2006.01)
(52) U.S. Cl. ........ 438/629; 438/426; 438/637; 438/642; 438/778
(58) Field of Classification Search .................. 438/626, 438/629, 637, 642, 778, FOR. 388, FOR. 390, 438/FOR. 395
See application file for complete search history.

(56) References Cited

U.S. PATENT DOCUMENTS

| | | | |
|---|---|---|---|
| 5,567,300 A | 10/1996 | Datta et al. | |
| 6,171,467 B1 * | 1/2001 | Weihs et al. | ................ 205/93 |
| 6,495,443 B1 | 12/2002 | Lopatin et al. | |
| 6,709,565 B2 | 3/2004 | Mayer et al. | |
| 6,848,977 B1 | 2/2005 | Cook et al. | |
| 2005/0092399 A1 | 5/2005 | Ronay | |

* cited by examiner

*Primary Examiner* — N Drew Richards
*Assistant Examiner* — Joannie A Garcia
(74) *Attorney, Agent, or Firm* — Connolly Bove Lodge & Hutz LLP

(57) ABSTRACT

A conductor-dielectric interconnect structure is fabricated by providing a structure comprising a dielectric layer having a patterned feature therein; depositing a plating seed layer on the dielectric layer in the patterned feature; depositing a sacrificial seed layer on the plating seed layer in the via; reducing the thickness of the sacrificial seed layer by reverse plating; and plating a conductive metal on the sacrificial seed layer in the patterned feature. Also provided is a dielectric layer having a via therein; a plating seed layer on the dielectric layer in the patterned feature; and a discontinuous sacrificial seed layer located in the patterned feature.

16 Claims, 9 Drawing Sheets

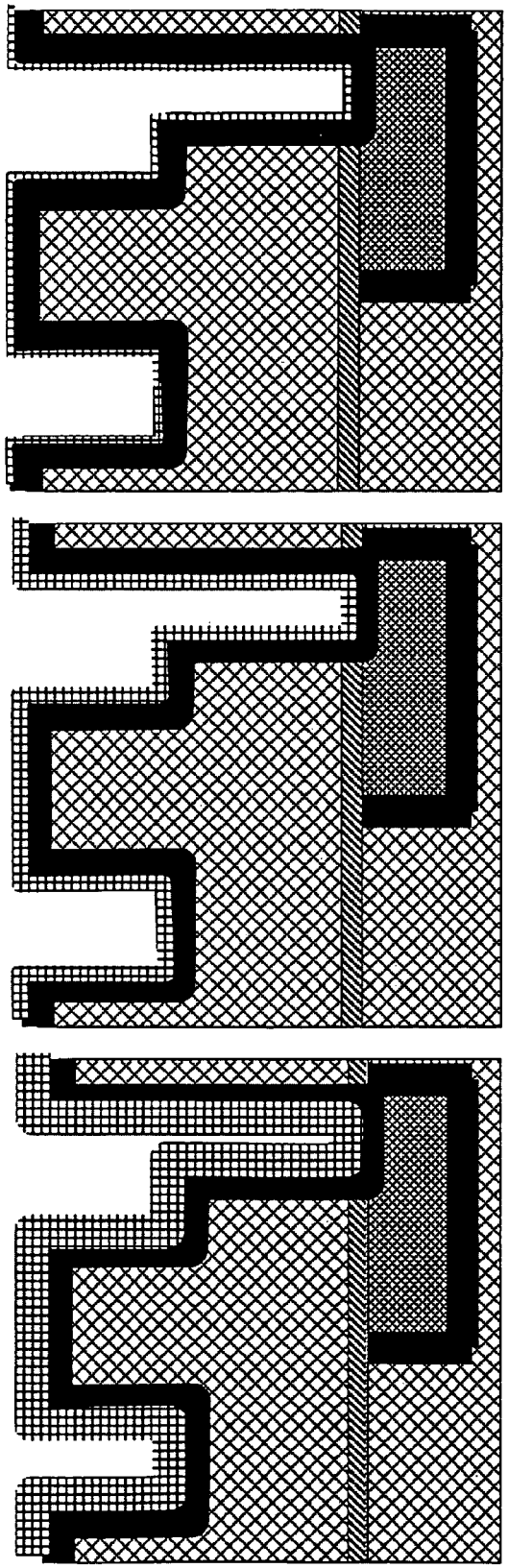
Fig. 6 (B)
(A)  (B)  (C)
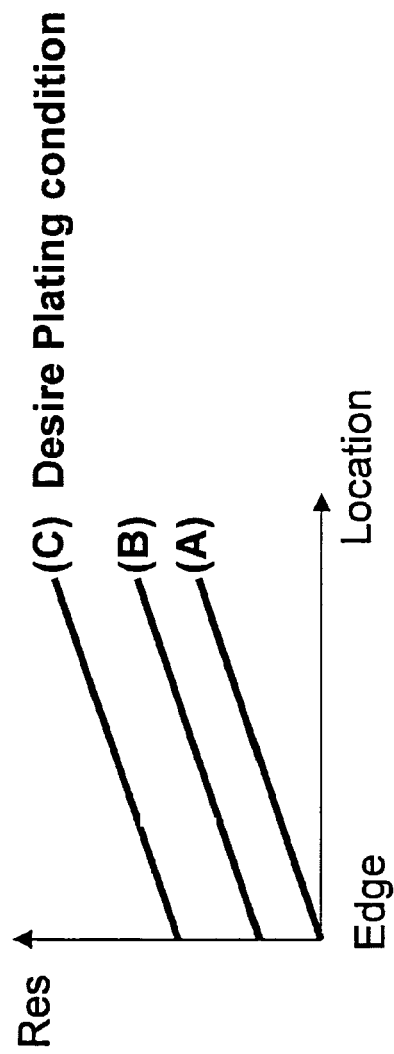
(C) Desire Plating condition
In-Situ monitoring wafer resistivity during the "reverse" plating process

CONDUCTOR-DIELECTRIC STRUCTURE AND METHOD FOR FABRICATING

This application is a Divisional Application of U.S. Pat. No. 11/286,093, filed Nov. 23, 2005, the entire disclosure of which are herein incorporated by reference in their entireties.

TECHNICAL FIELD

The present disclosure relates to a conductor-dielectric structure and a method for fabricating the structure. In particular, the present disclosure relates to a method for fabricating a BEOL (Back End of the Line) interconnect structure. The present disclosure relates generally to a new process which reduces the occurrence of discontinuities within the metallization, such as voiding or seams. According to the present disclosure, a sacrificial seed layer is employed to prevent underneath plating seed layer from oxidation.

BACKGROUND

During the manufacture of semiconductor technology, films of various materials are sequentially deposited and patterned on a semiconductor substrate such as a silicon substrate. For the back-end-of-line (BEOL) processing, these materials include metallization levels for the interconnect structures, dielectric levels used for insulation and capping, and barrier layers to prevent diffusion and oxidation of the interconnects. The current choice for interconnect metallization is copper, manufactured in a dual-damascene method. Dielectric materials include silicon oxide, deposited by plasma enhanced chemical vapor deposition (PECVD) using silane ($SiH_4$) or tetraethylorthosilicate (TEOS) precursors, or organosilicate glass or borophosphosilicate glass (BPSG), deposited by chemical vapor deposition (CVD) for high-performance interconnect applications. The organosilicate glass can be in its dense form or in a form that includes porosity.

The choice of barrier layers includes tantalum, tantalum nitride, tungsten nitride ruthenium, iridium, and titanium and alloys of these metals.

As the critical dimension (CD) decreases, conformality and coverage problems from physical vapor deposition (PVD) techniques get worse for diffusion barrier and Cu plating seed depositions. These in turn will lead to fill issues during plating such as center and edge voids which cause reliability concerns and yield degradation. One way around this problem is to reduce the overall thickness of PVD material, and utilize a single layer of liner material which serves as both the diffusion barrier and plating seed. Another way around the aforementioned issue, is the use of chemical vapor deposition (CVD) or atomic layer deposition (ALD) which result in better step coverage and conformality as compared with conventional PVD techniques.

An example of such a material is Ruthenium (O. Chyan et al., "Electrodeposition of Copper Thin Film on Ruthenium: A Potential Diffusion Barrier for Copper Interconnects," J. Electrochem. Soc., 150(5), p. C347, 2003). However, an issue that exists for the plating of Cu on Ru is the tendency of the Ru surface to oxidize on exposure to air which results in a decreased conductivity (and possibly adhesion) leading to poor plating. Apart from extremely poor fill of patterned structures, insufficient adhesion of Cu to surface oxide poses electromigration and stress reliability concerns. It has been suggested to address this problem by the use of process such a forming gas and hydrogen plasma exposures to reduce the surface oxide before plating. Drawbacks of these techniques include: 1) a time window (Queue time) exists within reduced wafers have to be plated before the surface oxide grows again, and 2) increased manufacturing cost due to required tooling for the reducing process, and increased raw process time.

A method that can eliminate or at least minimize plating voids inside an interconnect which is compatible with current plating tools and plating processes would be desirable.

SUMMARY

The present disclosure makes it possible to at least minimize plating voids inside interconnect features.

In particular, one aspect of the present disclosure relates to a method for fabricating an interconnect structure which comprises providing a structure comprising a dielectric layer having a patterned feature therein; depositing a plating seed layer on the dielectric layer in the via; depositing a sacrificial seed layer on the plating seed layer in the via; reducing the thickness of the sacrificial seed layer by reverse plating; and plating a conductive metal on the sacrificial seed layer in the patterned feature.

Another aspect of the present disclosure relates to a structure which comprises a dielectric layer having a patterned feature therein; a plating seed layer on the dielectric layer in the patterned feature; and a discontinuous sacrificial seed layer located in the patterned feature on the plating seed layer.

Other objections and advantages of the present disclosure will become readily apparent to those skilled in this art from the following detailed description, wherein it is shown and described only the preferred embodiments simply by way of illustration of the best mode contemplated. As will be realized, the disclosure is capable of other and different embodiments, and its several details are capable of modifications in various obvious respects, without departing from the disclosure. Accordingly, the description is to be regarded as illustrative in nature and not as restrictive.

BRIEF DESCRIPTION OF DRAWINGS

The features of the disclosure believed to be novel and the elements characteristic of the disclosure are set forth with particularity in the appended claims. The figures are for illustration purposes only. The disclosure itself, however, both as to organization and method of operation, may best be understood by reference to the detailed description which follows taken in conjunction with the accompanying drawings in which:

FIG. 6 is a graph illustrating in-situ monitoring of resistivity.

BEST AND VARIOUS MODES

In order to facilitate an understanding of the present disclosure reference is made to the Figures.

Bearing in mind the problems and deficiencies of the prior art, the present disclosure provides a structure which makes it possible to reduce the occurrence of discontinuities within the metallization, such as voiding or seams.

Figure 1:
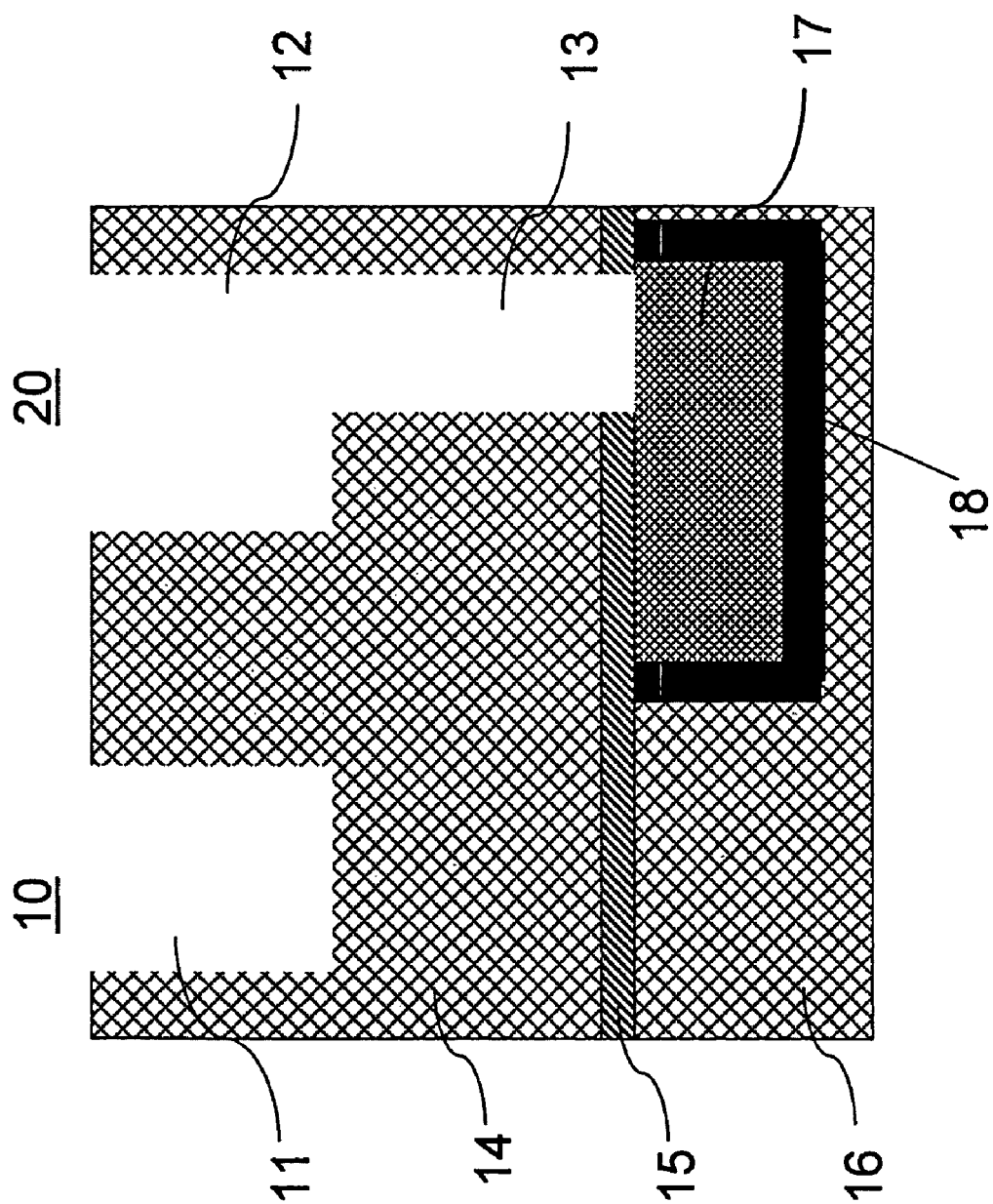
FIGS. 1-5, 7 and 8 are schematic cross-sectional views of the structure in various stages of a fabrication process of the present disclosure.

FIG. 1 illustrates a structure comprising an interlayer dielectric 16, a barrier layer 18 located in a trough in dielectric 16 and conductive layer 17 located above barrier layer 18. Numerals 10 and 20 represented a single damascene etching profile and a dual damascene etching profile, respectively located in interlayer dielectric material 14. Numeral 11 represents the trench in single damascene etching profile 10. Numeral 12 represents: the trench in dual damascene etching profile 20, while numeral 13 represents the via. A capping layer 15 is present on interlayer dielectric 16, above barrier layer 18 and portions of conductive layer 17.

Typical insulating or dielectric materials 14 and 16 include silicon dioxide ($SiO_2$) phosphosilicate glass (PSG), boron doped PSG (BDPSG) or tetraethylorthosilicate (TEOS), and more typically low-k dielectrics having a dielectric constant of less than 3.9 such as SILK (available from Dow Chemical), SiCH (available from AMAT under the trade designation BLOK), SiCOH (available from Novellus under the trade designation Coral, from AMAT under the trade designation Black Diamond and from ASM under the trade designation Auora), SiCHN (available from IBM under the trade designation N Blok), CVD carbon-doped oxide, porous CVD carbon-doped oxide, porous and non-porous organo silicates, porous and non-porous organic spin-on polymers.

Examples of typical capping layers are SiCOH, Blok, $SiO_2$, NBlok, $Si_3N_4$ and spin-on silesquioxanes. The capping layer is about 10 nm to about 60 nm. The function of the capping layer 15 is for preventing diffusion of the interconnect material 17 into the dielectric layer 14.

Examples of some barrier layers 18 ate tantalum, tantalum nitride, titanium, titanium nitride, tungsten, tungsten nitride, ruthenium, rhenium, cobalt, molybdenum, chromium, iridium, platinum, silicon, carbon, zirconium, niobium, rhodium, palladium; mixtures thereof and alloys thereof. The alloys of the above metals can include various alloying materials such as, but not limited to O, S, N, B and P. Also the barrier layer 18 can comprise a plurality of layers of the same and/or different compositions.

More typical barrier layers are tungsten, titanium, tantalum, nitrides thereof, Ru, and alloys thereof. The barrier layer 18 is typically deposited by chemical vapor deposition (CVD) or by sputtering such as physical vapor deposition (PVD) or ionized physical vapor deposition (IPVD).

The barrier layer is typically about 8 nm to 80 nm thick.

The conductive material is typically Cu, Cu alloys, Al, Al alloys, Ag, Ag alloys, Au, Au alloys, W or W alloys, and more typically Cu containing conductive materials (e.g. Cu and Cu alloys). Typically plating baths for Cu and Cu alloys are disclosed in US Patent Publication 2004/178078 A1, disclosure of which is incorporated herein by reference.

Figure 2:
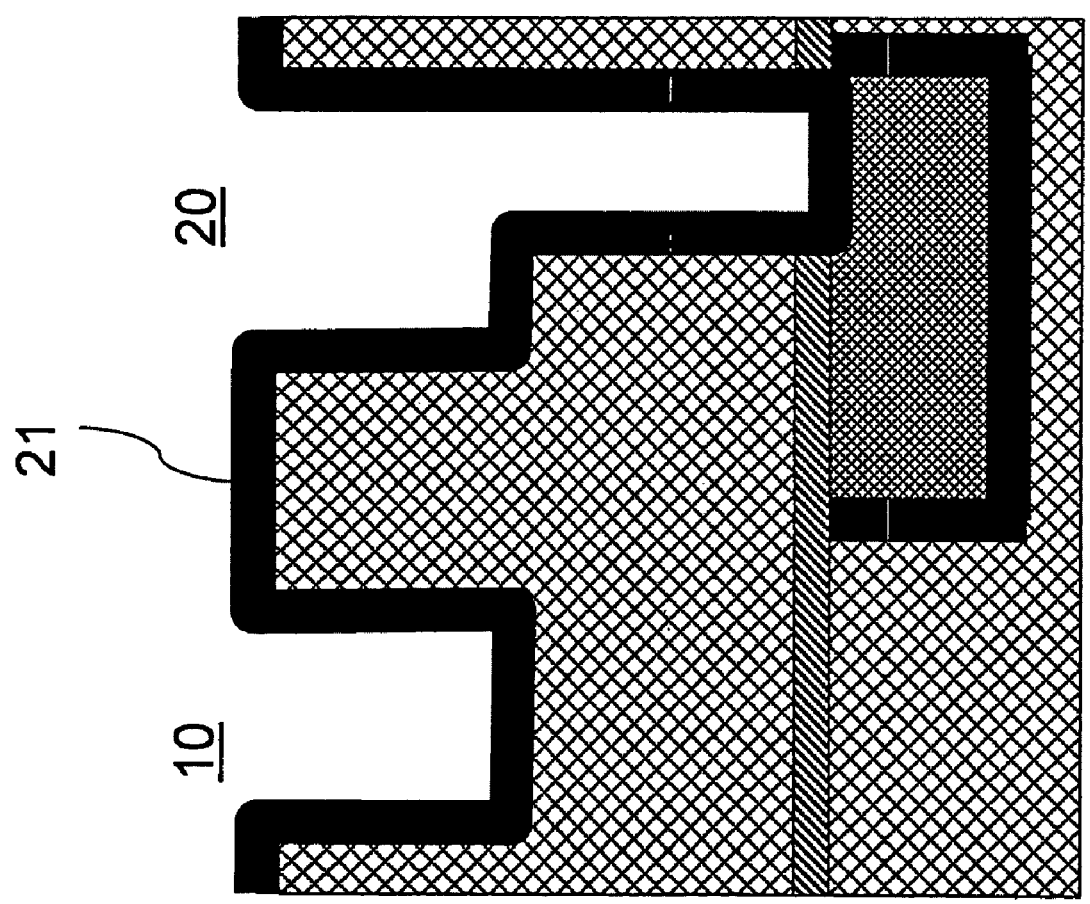

See FIG. 2 wherein a diffusion barrier layer and plating seed 21 is deposited on the structure over interlayer dielectric (ILD) 14 and the exposed portion of conductive layer 17. The diffusion barrier and plating seed layer 21 typically comprises ruthenium and/or iridium. Also, layer 21 can comprise a plurality of layers such as Ru and Ta and/or TaN; Ir and Ta and/or TaN; Ru and TiSiN; and Ir and TiSiN.

The layer 21 is typically deposited by CVD or ALD for Ru, Ir, and TaN. Although PVD deposition technologies are also available for deposition of Ru, Ir and TaN.

The layer 21 is typically about 2 nm to 80 nm and more typically about 4 nm to 20 nm thick.

Figure 3:
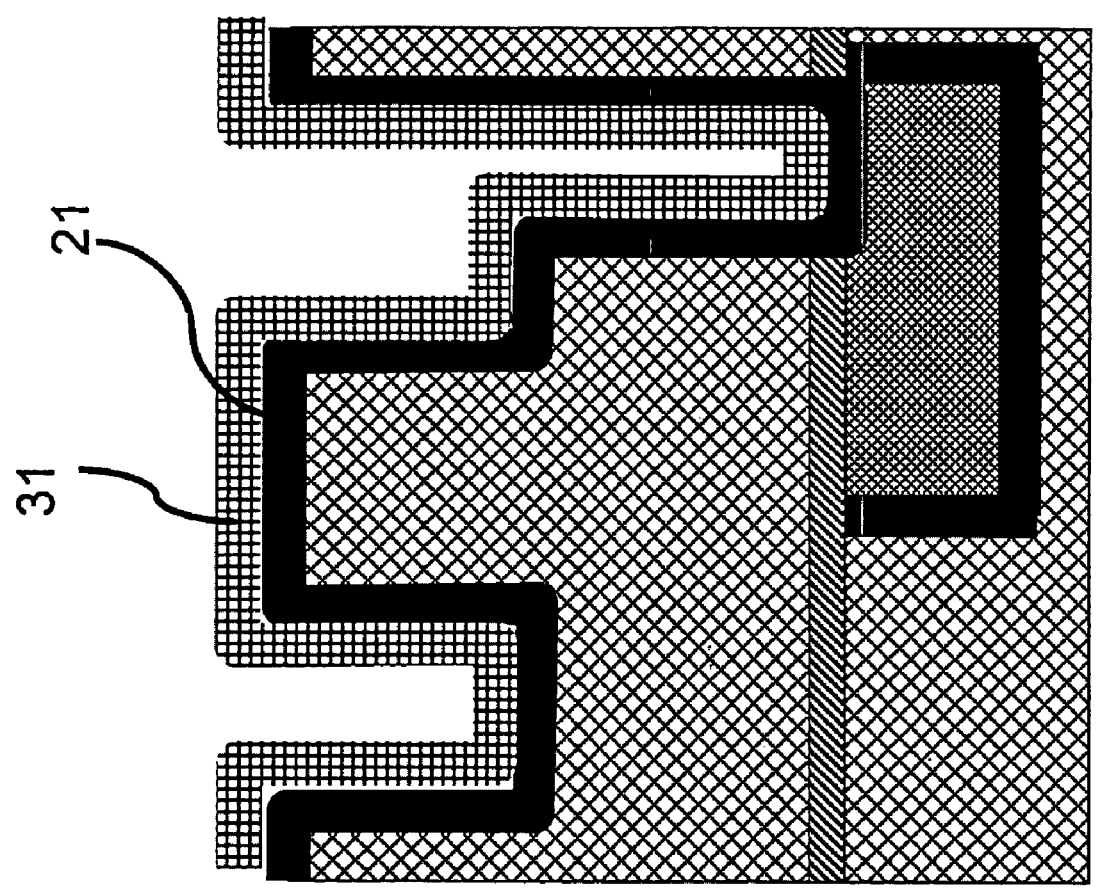

Next a relatively thick sacrificial seed layer 31 as illustrated in FIG. 3 is deposited over plating seed layer 21. Sacrificial seed layer 31 is typically Cu or a Cu alloy and is typically deposited by PVD.

The layers 31 is provided to prevent or at least minimize oxidation of layer 21. The sacrificial seed layer 31 is deposited in the same platform, which is operated under vacuum, as the plating layer 21, so that there is no air expose between depositions of the two films and the surface of the deposited layer 21 is free of oxygen. A platform contains several deposition chambers with wafer transportation between the chambers being under vacuum without air expose in between.

The sacrificial seed layer 31 is typically about 3 nm to about 100 nm thick and more typically about 5 nm to about 50 nm thick. It needs to be thick enough to minimize the possibility of discontinuities and/or pin holes that could expose the underlayer 21 to being oxidized.

After deposition of layers 21 and 31 in a single platform, the wafer is then moved to another platform for a thickness thing process of the sacrificial layer 31 and deposition of conductive material into the patterned features. During the thickness thinning process and the conductive material deposition process, the entire wafer is completely immersed in a plating bath.

Figure 4:
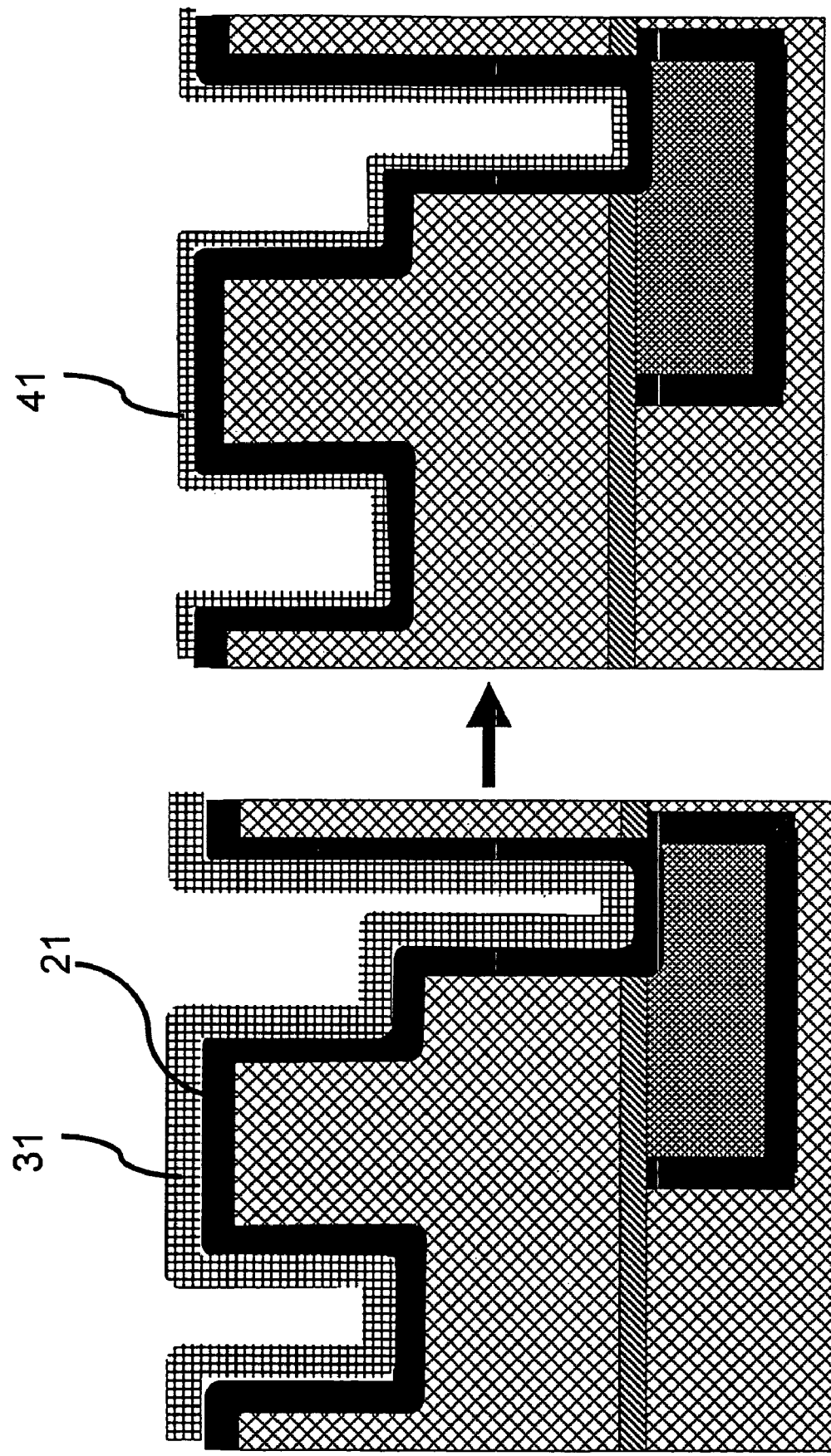
Figure 5:
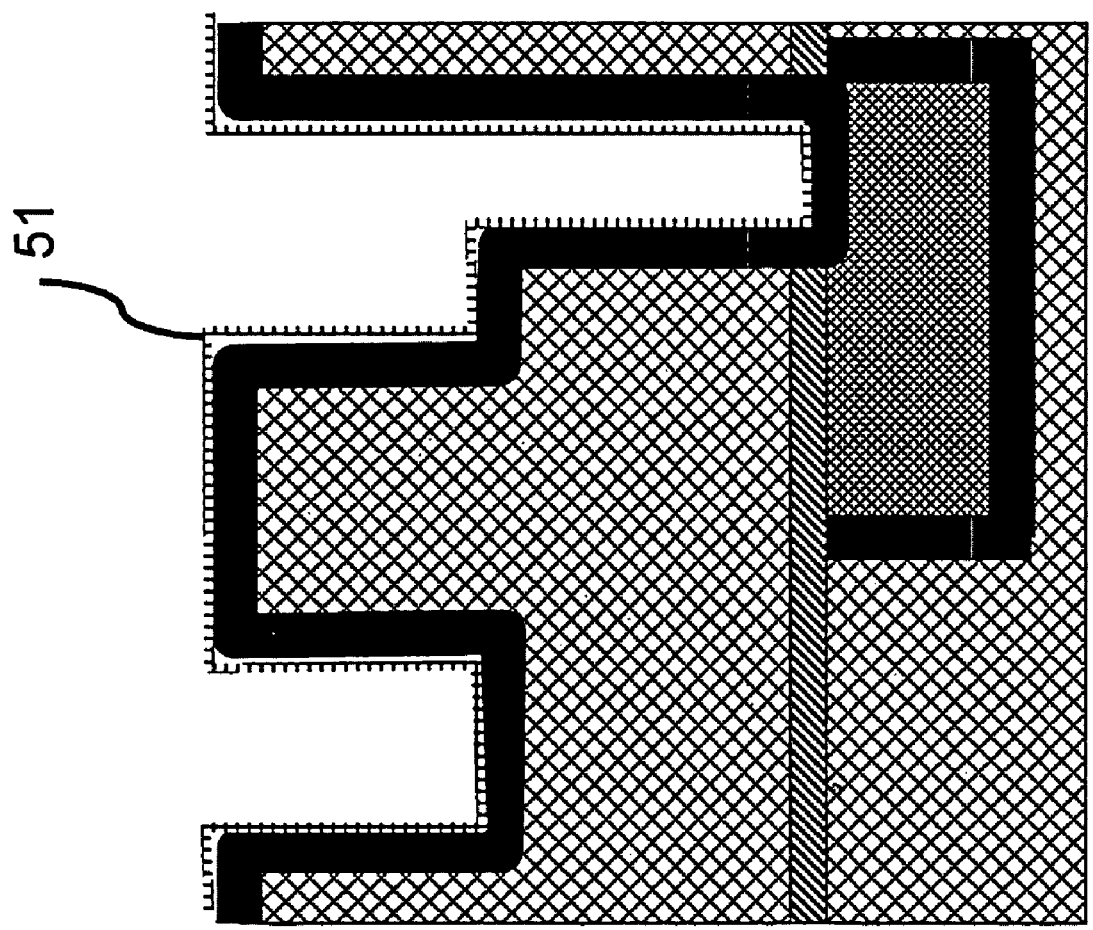

As illustrated in FIG. 4, the thickness of the sacrificial seed 31 is reduced by using a reverse plating process to create thinned layer 41. The reverse plating process involves reversing the current in the electroplating bath. A typical reverse plating process is described in U.S. Pat. No. 5,486,282 to Datta and assigned to International Business Machines Corporation, the assignee of this application, entire disclosure of which is incorporated herein by reference. The thinning involves chemical etching whereby in one example, cupric ions react with copper to form cuprous ions. Because the thickness thinning process of sacrificial seed layer 31 and the deposition process of the conductive layer 71 are carry out inside a same plating bath, and the wafer is entirely immersed in the plating bath during the processes, the underneath layer 21 is completely prevent from exposition to the air.

The thinned sacrificial layer is typically less than 50% of layer 31 and more typically less than 20% of layer 31.

In an even more typical process, the reverse plating can be continued to produce a discontinuous sacrificial seed layer 51. The discontinuous sacrificial seed layer 51 is typically 1 nm to about 10 nm thick and covers at least about 30% of the underlying layer 21.

As illustrated in FIG. 6, the resistivity of the wafer can be monitored during the reverse plating process to determine when the desired thickness of layer 41 is achieved.

Figure 7:
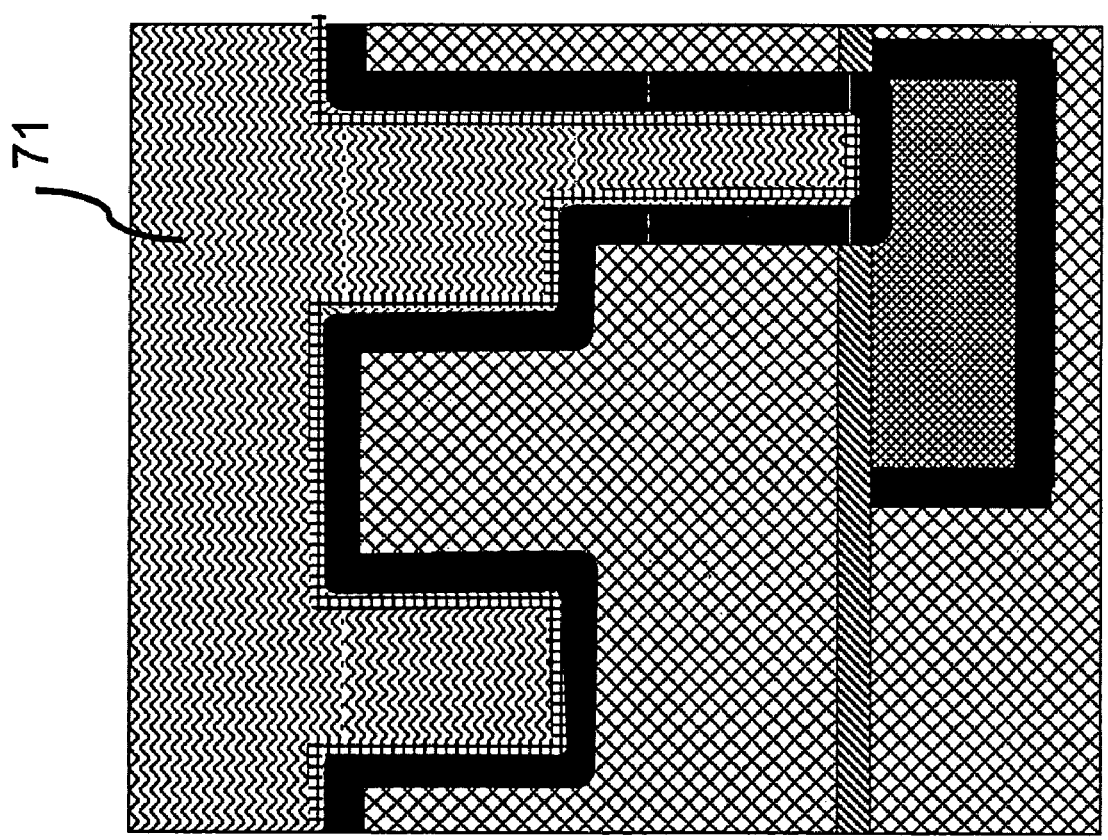

Next as illustrated in FIG. 7, a conductive interconnected 71 is blanket deposited typically by electroless or electroplating to fill the openings 11, 12 and 13. Typical interconnection materials 71 are Cu, Cu alloys such as CuAl, Al, Al alloys such as AlCu, Ag, Ag alloys, Au, Au alloys, W and W alloys with Cu and Cu alloys being more typical. Suitable electroless and electroplating baths are known and need not be describe herein. (Nevertheless, if possible, please provide reference to some). Typical techniques are disclosed in U.S. Ser. No. 09/348,632 and U.S. Pat. No. 6,331,237 B1 to Andricacos et al., entire disclosures of which are incorporated herein by reference. Because the thickness thinning process of sacrificial seed layer 31 and the deposition process of the conductive layer 71 are carried out inside the same plating bath, and the wafer is entirely immersed in the plating bath during the processes, the underneath layer 21 is completely prevent from exposition to the air.

Figure 8:
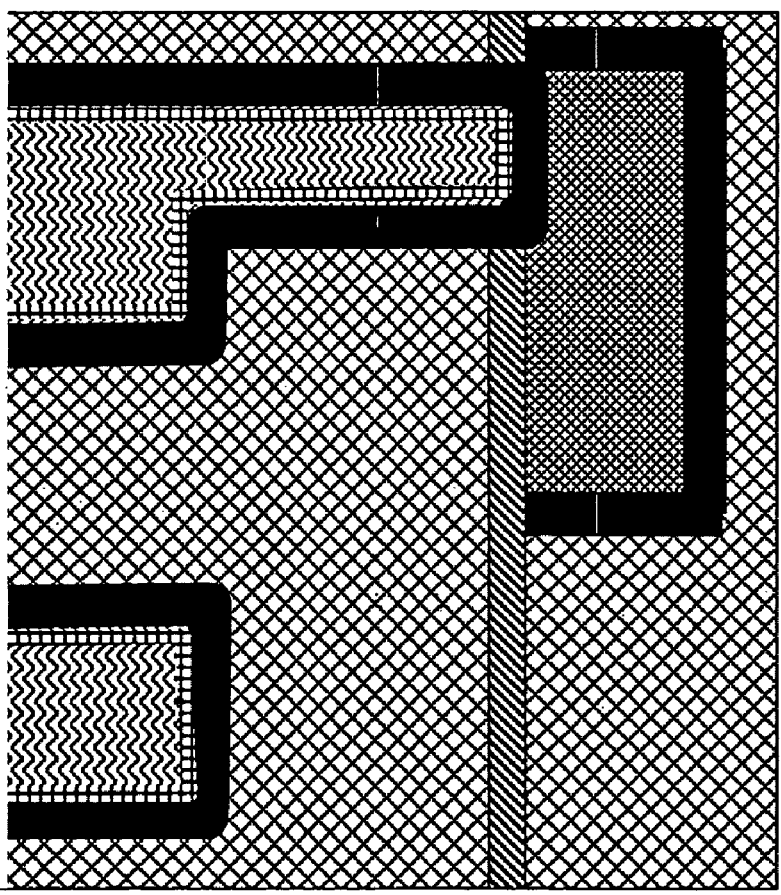
Figure 9:
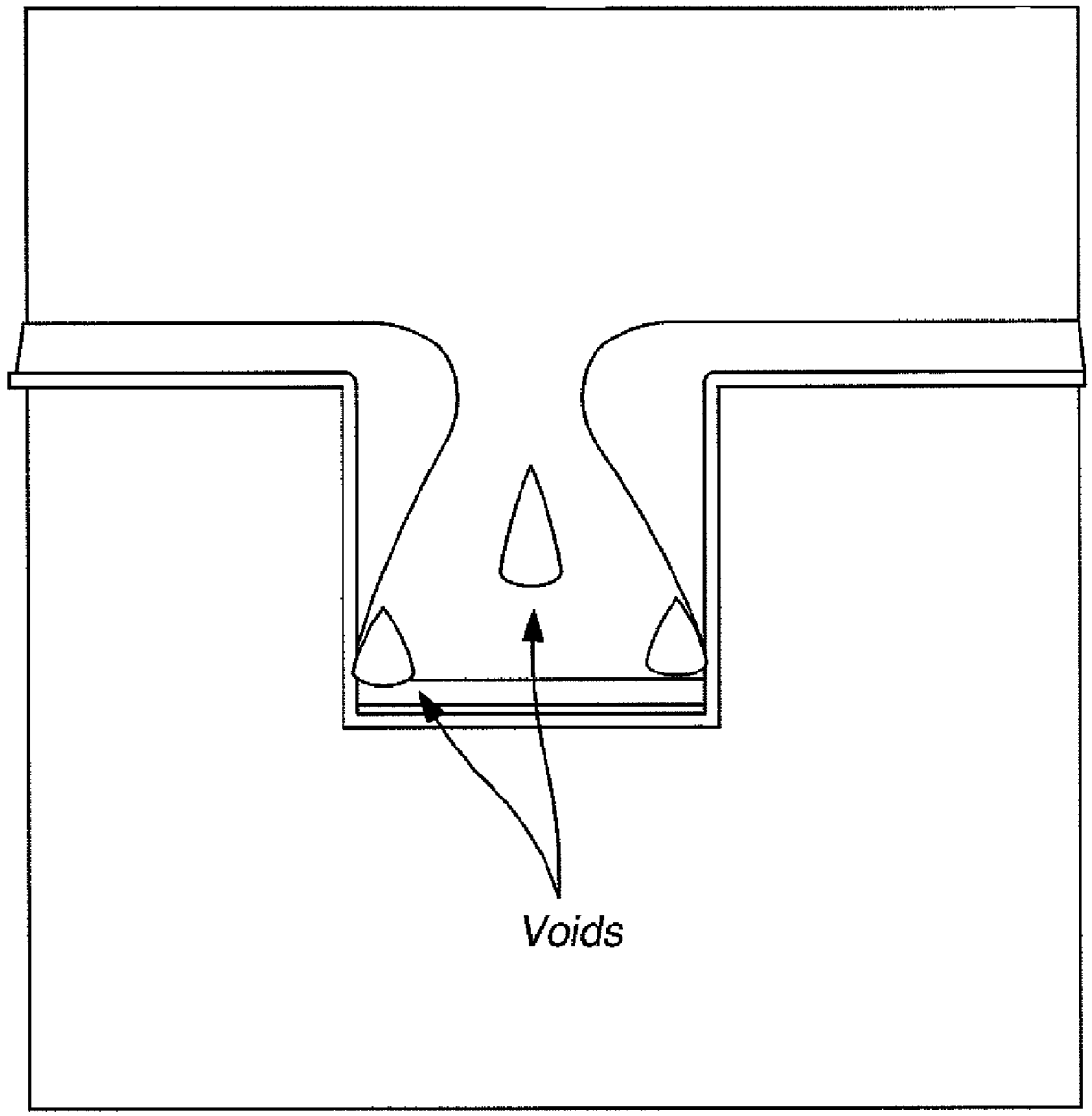
FIG. 9 is a schematic in cross-sectional view illustrating voids due to decreased CD in future nodes.

As illustrated in FIG. 8, the structure is then plararized to remove the overburden of the interconnect material 71 such as by Chemical Mechanical Polishing (CMP). Typical slurries for CMP contain an abrasive particle such as alumina, silica, ceria, zirconia, or titanium dioxide, along with an oxidizing agent such as ferric nitrate, potassium iodate, ammonium cerium nitrate, potassium ferricyanide, silver nitrate, sodium hypochlorite, potassium perchlorate, potassium permanganate or hydrogen peroxide.

The foregoing description illustrates and describes the disclosure. Additionally, the disclosure shows and describes only the preferred embodiments but, as mentioned above, it is to be understood that it is capable of use in various other combinations, modifications, and environments and is capable of changes or modifications within the scope of the invention concept as expressed herein, commensurate with the above teachings and/or the skill or knowledge of the relevant art. The embodiments described herein above are further intended to explain best modes known by applicant and to enable others skilled in the art to utilize the disclosure in such, or other embodiments and with the various modifications required by the particular applications or uses thereof. Accordingly, the description is not intended to limit the invention to the form disclosed herein. Also it is intended that the appended claims be construed to include alternative embodiments.

All publications and patent applications cited in this specification are herein incorporated by reference, and for any and all purposes, as if each individual publication or patent application were specifically and individually indicated to be incorporated by reference.

What is claimed is:

1. A structure which comprises a dielectric layer having a patterned feature therein; a plating seed layer on the dielectric layer in said patterned feature; and a sacrificial seed layer located in said patterned feature on said plating seed layer; wherein the thickness of the sacrificial seed layer is reduced to provide a discontinuous sacrificial seed layer and the thickness of the sacrificial seed layer is reduced to at least 50% of the original thickness; wherein the plating seed layer comprises Ru or Ir or both and which further comprises a conductive interconnect on the sacrificial seed layer.

2. The structure of claim 1 wherein the sacrificial seed layer comprises Cu or Cu alloy.

3. The structure of claim 1 wherein the plating seed layer comprise Ru and Ta and/or TaN; Ir and Ta and/or TaN; Ru and TiSiN; and Ir and TiSiN.

4. The structure of claim 1 wherein the sacrificial seed layer is about 3 nm to about 100 nm thick.

5. The structure of claim 1 wherein the conductive material is selected from the group consisting of Cu, Al, Ag, Au, W and alloys thereof.

6. A method for fabricating a conductor-dielectric interconnect structure which comprises providing a structure comprising a dielectric layer having a patterned feature therein; depositing a plating seed layer on the dielectric layer in said patterned feature in a platform; depositing a sacrificial seed layer having a thickness on said plating seed layer in said patterned feature; reducing the thickness of the sacrificial seed layer by reverse plating in a plating bath; wherein the thickness of the sacrificial seed layer is reduced to at least 50% of the original thickness and depositing a conductive material on the sacrificial seed layer in said patterned feature; and wherein the structure further comprises a capping layer located above the dielectric layer and barrier layer.

7. The method of claim 6 wherein the structure includes a single or dual damascene structure or both.

8. The method of claim 6 wherein the plating seed layer comprises Ru or Ir or both.

9. The method of claim 6 wherein the sacrificial seed layer comprises Cu or a Cu alloy.

10. The method of claim 6 wherein the plating seed layer comprise Ru and Ta and/or TaN; Ir and Ta and/or TaN; Ru and TiSiN; and Ir and TiSiN.

11. The method of claim 6 wherein the sacrificial seed layer is about 3 nm to about 100 nm thick.

12. The method of claim 6 wherein the thickness of the sacrificial seed layer is reduced to provide a discontinuous sacrificial seed layer.

13. The method of claim 6 wherein the conductive material is selected from the group consisting of Cu, Al, Ag, Au, W and alloys thereof.

14. The method of claim 6 wherein said conductive material comprises Cu or Cu alloy.

15. The method of claim 6 which further comprises planarizing the conductive material.

16. The method of claim 6 wherein the plating seed layer is deposited by chemical vapor deposition (CVD) or atomic layer deposition (ALD) techniques.

* * * * *